US008836058B2

(12) United States Patent
Gajek et al.

(10) Patent No.: US 8,836,058 B2
(45) Date of Patent: Sep. 16, 2014

(54) ELECTROSTATIC CONTROL OF MAGNETIC DEVICES

(71) Applicant: International Business Machines Corporation, Armonk, NY (US)

(72) Inventors: Marcin J. Gajek, New York, NY (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 13/688,592

(22) Filed: Nov. 29, 2012

(65) Prior Publication Data
US 2014/0145278 A1    May 29, 2014

(51) Int. Cl.
*H01L 29/82*    (2006.01)
*H01L 43/02*    (2006.01)

(52) U.S. Cl.
CPC ................................. *H01L 43/02* (2013.01)
USPC ........... 257/421; 257/422; 257/423; 257/427; 257/E29.323; 438/3; 365/157; 365/158; 365/171; 365/172; 365/173; 360/324.2; 360/326

(58) Field of Classification Search
CPC ....... H01L 43/08; H01L 27/22; H01L 43/065; G11C 11/16
USPC ........ 257/20, 414, 421–427, E29.323; 438/3; 365/157–158, 171–173; 360/324–326
See application file for complete search history.

(56) References Cited

U.S. PATENT DOCUMENTS

| 6,365,286 B1 | 4/2002 | Inomata et al. |
| 7,283,386 B2 | 10/2007 | Shin et al. |
| 7,965,542 B2 | 6/2011 | Asao |
| 8,189,370 B2 | 5/2012 | Hayakawa |
| 2001/0004307 A1* | 6/2001 | Saito et al. ............... 360/324.12 |
| 2002/0177013 A1* | 11/2002 | Hiramoto et al. ............. 428/702 |
| 2007/0064342 A1* | 3/2007 | Nakamura et al. ............ 360/119 |
| 2011/0170339 A1 | 7/2011 | Wunderlich et al. |

FOREIGN PATENT DOCUMENTS

| EP | 2209123 A1 | 7/2010 |
| JP | 2004179219 | 6/2004 |
| JP | 2006179891 | 7/2006 |

* cited by examiner

*Primary Examiner* — Jami M Valentine
(74) *Attorney, Agent, or Firm* — Cantor Colburn LLP; Vazken Alexanian

(57) ABSTRACT

A magnetic device includes a first electrode portion, a free layer portion arranged on the first electrode portion, the free layer portion including a magnetic insulating material, a reference layer portion contacting the free layer portion, the reference layer portion including a magnetic metallic layer, and a second electrode portion arranged on the reference layer portion.

19 Claims, 2 Drawing Sheets

ELECTROSTATIC CONTROL OF MAGNETIC DEVICES

FEDERALLY SPONSORED RESEARCH AND DEVELOPMENT

This invention was made with government support under contract number N66001-11-14110 awarded by Defense Advanced Research Projects Agency. The government may have certain rights in the invention.

FIELD OF INVENTION

The present invention relates generally to control of magnetic devices, and more specifically, to electrostatic control of magnetic devices.

DESCRIPTION OF RELATED ART

Magnetic devices such as, for example, magnetic random access memory (MRAM) cells include magnetic portions that may be controlled such that the magnetic orientation of the magnetic portion changes when, for example, a magnetic field interacts with the magnetic portion. The magnetic orientation of the magnetic portion affects properties of the cell, for example the resistance in the cell. Thus, for a first magnetic orientation, the cell may exhibit a first resistance for a given applied voltage, and for a second magnetic orientation, the cell may exhibit a second resistance at the given applied voltage. The differences in magnetic orientations, or states, allows the MRAM cell to be used in an array of cells to store data.

Previous MRAM cells used current-induced fields, or a torque to the magnetization induced by applying a direct injection of spin polarized current. The use the previous current-based methods included a relatively high current density in the applied currents and were subject to undesirably high energy dissipation.

BRIEF SUMMARY

According to an exemplary embodiment of the present invention, a magnetic random access memory (MRAM) cell includes a first electrode portion, a free layer portion arranged on the first electrode portion, the free layer portion including a ferromagnetic insulating ferrite material, a reference layer portion contacting the free layer portion, the reference layer portion including an arrangement of metallic layers, and a second electrode portion arranged on the reference layer portion.

According to another exemplary embodiment of the present invention, a magnetic random access memory (MRAM) cell includes a first electrode portion arranged on a substrate, a reference layer portion disposed on the first electrode, the reference layer portion including an arrangement of metallic layers, a free layer portion arranged on the reference layer portion, the free layer portion including a ferromagnetic insulating ferrite material, and second electrode portion arranged on the free layer portion.

According to yet another exemplary embodiment of the present invention, a magnetic device includes a first electrode portion, a free layer portion arranged on the first electrode portion, the free layer portion including a magnetic insulating material, a reference layer portion contacting the free layer portion, the reference layer portion including a magnetic metallic layer, and a second electrode portion arranged on the reference layer portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As discussed above, current-based MRAM devices utilized an undesirably high current density that resulted in undesirably high energy dissipation. The exemplary embodiments described herein provide for an MRAM cell that is operative to switch states using a lower voltage that results in a lower energy dissipation.

In this regard, the exemplary embodiments of MRAM cells described herein are operative to change states when an electrostatic field is induced in the cell. The use of such an electrostatic field provides for the use of a relatively lower applied voltage to change the state of the device as opposed to the higher voltages used in current-based MRAM devices.

Figure 1:
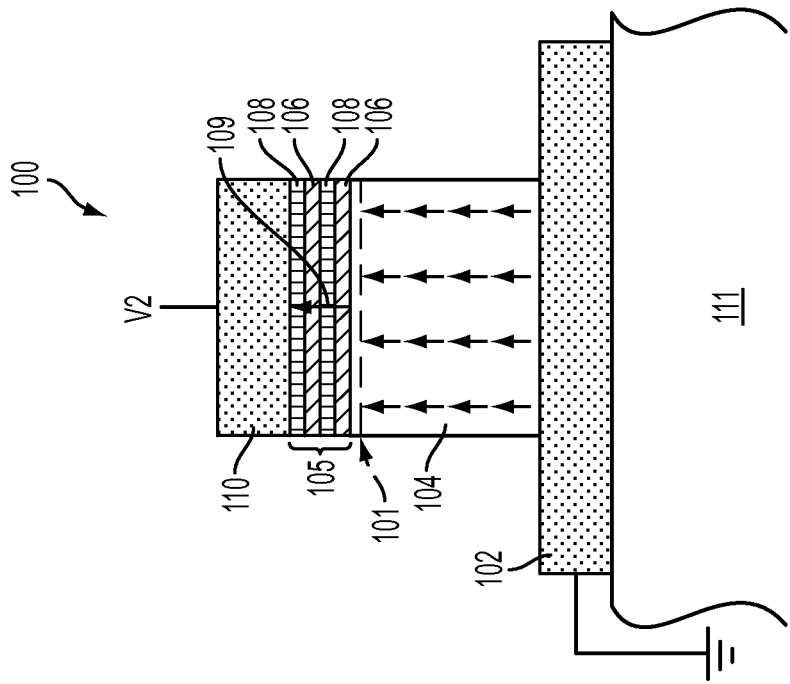
FIG. 1 illustrates an exemplary embodiment of an MRAM cell in a first state.

FIG. 1 illustrates an exemplary embodiment of an MRAM cell (cell) 100 in a first state. The cell 100 may be arranged on a substrate 111 in an array of a plurality of cells 100. Such an array may include any desired configuration. The cell 100 includes a first electrode portion 102 that includes a non-magnetic conductive material such as, for example, Al, Ag, Au, Ti, Ta, Ru, or Cu. A ferromagnetic insulating ferrite (free layer) portion 104 is arranged in contact with the first electrode portion 102. Some embodiments may include be another material deposited between portion 104 and portion 102, such as, for example, a metal with a high atomic number such as Pt, Pd, Au, or Bi in order to modify the surface magnetic anisotropy of portion 104 or a seed to promote a certain crystalline structure/orientation of portion 104, an insulator may be used so as to change the texture/crystallinity properties of layer 104 such as MgAl2O4 or sapphire, The free layer portion 104 may include a material such as, for example, $NiFe_2O_4$, $MnFe_2O_4$, and $CoFe_2O_4$; Zn-based ferrites; diluted magnetic semiconductors such as, ZnO:Co and $TiO_2$:Co, GaMnAs; and antiferromagnetic insulators including transition metal oxides such as CoO, NiO; and fluorides such as $MnF_2$. A reference layer portion 105 is arranged on the free layer portion 104. The reference layer portion 105 includes layers of materials. A second electrode portion 110 that includes a non-magnetic conductive material such as, for example, Al, Au, Ag, or Cu, Pt, Pd, Ru, Ta, Ti, TaN, TiN, CuN is arranged on the reference layer portion 105.

In this regard, the reference layer portion 105 may include one, two or more layers of materials. In the illustrated embodiment, the reference layer portion 105 is a ferromagnetic metallic multilayer arrangement. A first material layer 106 includes a magnetic metallic material such as, for example, Co (in conjunction with Ni, Pt, Pd, or Au for the second material layer 108 described below); Ni (in conjunction with Co or Pt, Au, Pd for the second material layer 108); Fe (in conjunction with Tb or Gd or Dy or any other magnetic rare earth element for the second material layer 108); or Co50Pt50 (in conjunction with Au for the second material layer 108). The reference layer portion 105 may be made out of a single layer comprised of, for example, CoPd or a ferrimagnetic rare earth-based alloy (two magnetic sublattices one) such as TbFe GdFe GdFeCo, TbFeCo, DyFeCo all of which may display an out-of plane magnetic moment.

A second material layer 108 includes a magnetic material such as Co, Tb, Gd, Dy and all of the magnetic rare earth elements or non magnetic material such as Pt, Au, Pd, for example, Ni or Pt. The free layer portion 104 and the reference layer portion 105 have different anisotropy directions. In the illustrated embodiment, the free layer portion 104 is shown as having an in-plane magnetic anisotropy direction (IMA) as illustrated by the arrows 107, while the reference layer portion 105 has a perpendicular anisotropy direction or out of plane anisotropy (PMA) as illustrated by the arrow 109. The illustrated embodiment of FIG. 1 shows but one example of the relative orientation of the anisotropy directions of the free layer portion 104 and the reference layer portion 105. Alternate embodiments may include, for example a reference layer portion 105 having an anisotropy direction IMA and a free layer portion 104 having an anisotropy PMA.

The free layer portion 104 and the reference layer portion 105 are coupled at contacting surfaces through direct exchange, which provides exchange bias. In the illustrated embodiment the free layer portion 104 is orientated IMA and has a low anisotropy field (Hk). Hk is a measure of the energetic stability of the magnetic moments of a given layer along the general anisotropy axis direction or its own anisotropy axis or easy-axis. The reference layer portion 105 is orientated PMA with a large out of plane anisotropy constant or anisotropy field. An exchange bias is present along the out of plane axis of the free layer portion 104 and along the easy axis of the reference layer portion 105 with an overall M-H hysteresis loop for the free layer portion 104 being shifted along the magnetic field axis by the value of the exchange bias.

In operation, a first voltage (V1) is applied to the second electrode portion 110, which applies an electric field across the free layer portion 104. The carrier concentration is changed at the interface surface 101 (where the free layer portion 104 and the reference layer portion 105 are in contact) within the screening length of the free layer portion 106. The screening length is the effective length over which the electric field penetrates into the metal. By electrostatically depleting the interface surface 101, the magnetic exchange between portion 105 and portion 104 at the interface 101 is reduced or turned off such that the magnetizations of both the free layer portion 104 and the reference layer portion 105 point along their respective easy axis.

Figure 2:
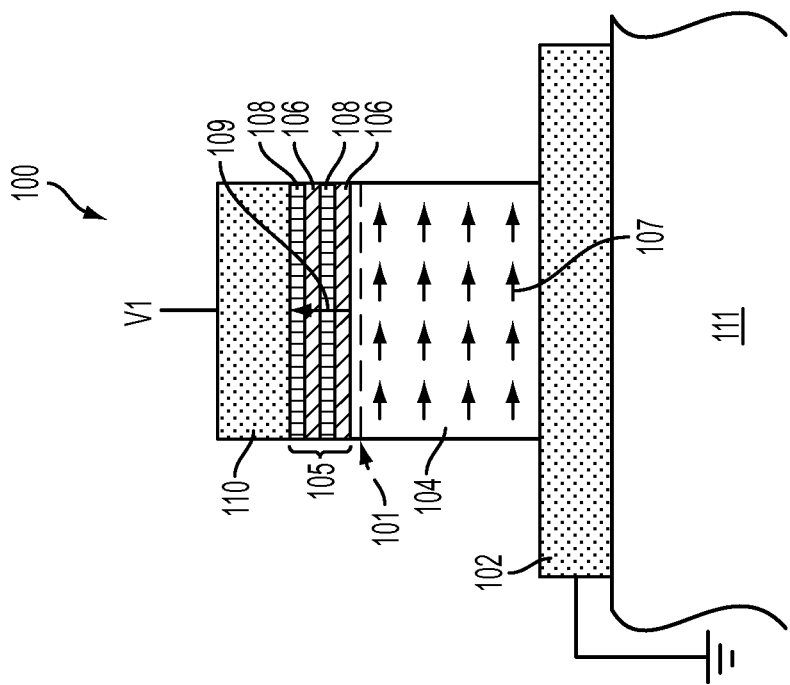
FIG. 2 illustrates the MRAM cell of FIG. 1 in a second state.

FIG. 2 illustrates the cell 100 in a second state. In operation, changing the direction of the electric field by applying a second voltage (V2) increases the carrier concentration and has a substantially inverse effect. Namely, the magnetization of the free layer portion 104 is forced towards the anisotropy axis 109 of the reference layer portion 105.

In an alternate exemplary embodiment, the composition or the crystalline structure of the free layer portion 104 may be chosen to affect a high anisotropy field along the easy axis of the free layer portion 104 such that the free layer portion 104 acts as a reference layer. The reference layer portion 105 may be fabricated to have a low perpendicular anisotropy field such that the magnetization of the layer 105 rotates towards the magnetization of the layer 104 while the orientation of the layer 104 remains fixed.

Figure 3:
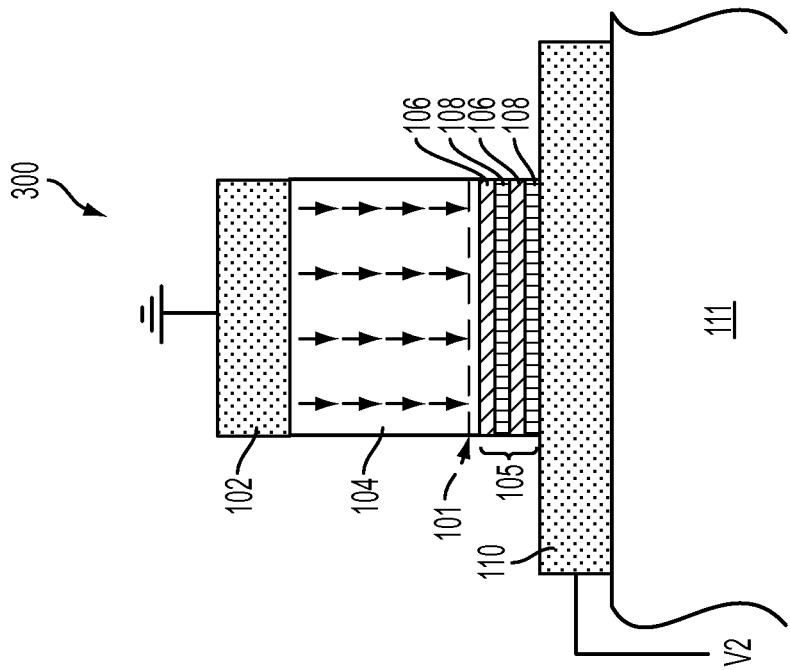
FIG. 3 illustrates an alternate exemplary embodiment of an MRAM cell in a first state.
Figure 4:
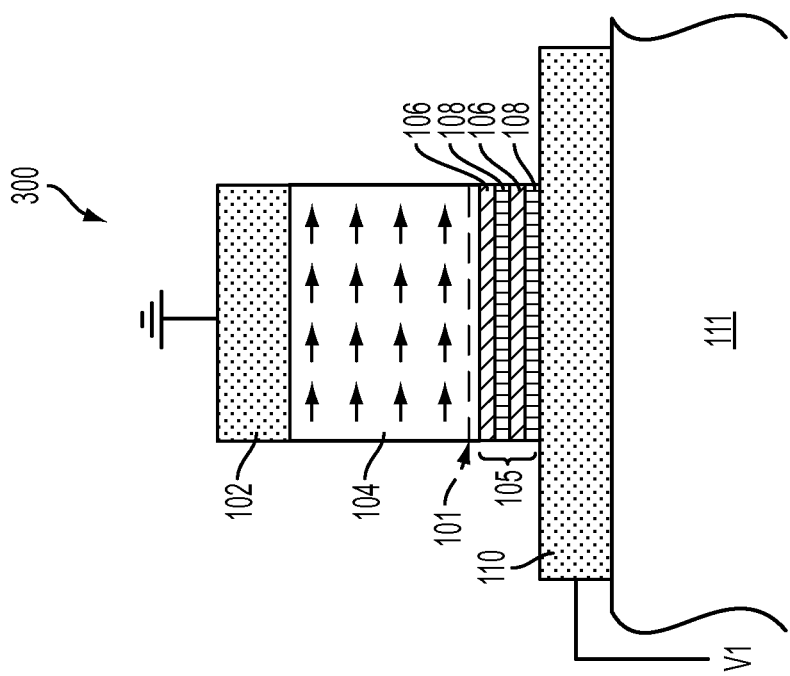
FIG. 4 illustrates the MRAM cell of FIG. 3 in a second state.

FIGS. 3 and 4 illustrate an alternate exemplary embodiment of a MRAM cell 300 in different respective states. The MRAM cell 300 operates in a similar manner and includes similar materials as the cell 100 described above. However, the second electrode portion 110 is arranged on the substrate 111.

The exemplary embodiments described herein provide for MRAM cells that may be operated at relatively low voltages by affecting electric fields that are operative to change the state of the cells.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A magnetic random access memory (MRAM) cell comprising: a first electrode portion; a free layer portion arranged on the first electrode portion, the free layer portion including a ferromagnetic insulating ferrite material; a reference layer portion contacting the free layer portion, the reference layer portion including an arrangement of metallic layers; and a second electrode portion arranged on the reference layer portion; and wherein the arrangement of metallic layers in the reference layer includes a first layer including nickel and a second layer disposed on the first layer, the second layer including platinum.

2. The cell of claim 1, wherein the second electrode portion is operative to receive an application of a first voltage associated with a first state, wherein in the first state, a magnetic orientation of the free layer portion is substantially orthogonal to a magnetic orientation of the reference layer.

3. The cell of claim 1, wherein the second electrode portion is operative to receive an application of a second voltage associated with a second state, wherein in the second state, a magnetic orientation of the free layer portion is substantially parallel to a magnetic orientation of the reference layer.

4. The cell of claim 1, wherein the second electrode portion is operative to receive an application of a first voltage associated with a first state, wherein the application of the first voltage is operative to affect an electric field in the free layer portion.

5. The cell of claim 1, wherein the second electrode portion is operative to receive an application of a second voltage associated with a second state, wherein the application of the second voltage is operative to affect an electric field in the free layer portion.

6. The cell of claim 1, wherein the free layer portion and the reference layer portion are in contact and coupled through direct exchange.

7. The cell of claim 1, wherein a portion of the free layer portion in contact with the reference layer portion is operative to change carrier concentration responsive to the application of an electric field across the free layer portion.

8. The cell of claim 1, wherein the ferromagnetic insulating ferrite material includes $NiFe_2O_4$, $MnFe_2O_4$, or $CoFe_2O_4$.

9. The cell of claim 1, wherein the first electrode is connected to ground.

10. A magnetic random access memory (MRAM) cell comprising: a first electrode portion arranged on a substrate; a reference layer portion disposed on the first electrode, the reference layer portion including an arrangement of metallic layers; a free layer portion arranged on the reference layer portion, the free layer portion including a ferromagnetic insulating ferrite material; and a second electrode portion arranged on the free layer portion; and wherein the arrangement of metallic layers in the reference layer includes a first layer including nickel and a second layer disposed on the first layer, the second layer including platinum.

11. The cell of claim 10, wherein the first electrode portion is operative to receive an application of a first voltage associated with a first state, wherein in the first state, a magnetic orientation of the free layer portion is substantially orthogonal to a magnetic orientation of the reference layer.

12. The cell of claim 10, wherein the first electrode portion is operative to receive an application of a second voltage associated with a second state, wherein in the second state, a magnetic orientation of the free layer portion is substantially parallel to a magnetic orientation of the reference layer.

13. The cell of claim 10, wherein the first electrode portion is operative to receive an application of a first voltage associated with a first state, wherein the application of the first voltage is operative to affect an electric field in the free layer portion.

14. The cell of claim 10, wherein the first electrode portion is operative to receive an application of a second voltage associated with a second state, wherein the application of the second voltage is operative to affect an electric field in the free layer portion.

15. The cell of claim 10, wherein the free layer portion and the reference layer portion are in contact and coupled through direct exchange.

16. The cell of claim 10, wherein a portion of the free layer portion in contact with the reference layer portion is operative to change carrier concentration responsive to the application of an electric field across the free layer portion.

17. A magnetic device comprising: a first electrode portion; a free layer portion arranged on the first electrode portion, the free layer portion including a magnetic insulating material; a reference layer portion contacting the free layer portion, the reference layer portion including a magnetic metallic layer; and a second electrode portion arranged on the reference layer portion; and wherein the arrangement of metallic layers in the reference layer includes a first layer including nickel and a second layer disposed on the first layer, the second layer including platinum.

18. The device of claim 17, wherein a magnetization of the free layer portion is operative to rotate by 90 degrees responsive to an application of a voltage across the first electrode portion and the second electrode portion.

19. The device of claim 17, wherein a magnetization of the reference layer portion is operative to rotate by 90 degrees responsive to an application of a voltage across the first electrode portion and the second electrode portion.

* * * * *